United States Patent
Wang

(10) Patent No.: US 6,469,324 B1
(45) Date of Patent: Oct. 22, 2002

(54) SEMICONDUCTOR LIGHT-EMITTING DEVICE AND METHOD FOR MANUFACTURING THE SAME

(76) Inventor: Tien Yang Wang, 468 Lowell St., Lexington, MA (US) 02420

( * ) Notice: Subject to any disclaimer, the term of this patent is extended or adjusted under 35 U.S.C. 154(b) by 0 days.

(21) Appl. No.: 09/577,446

(22) Filed: May 24, 2000

Related U.S. Application Data

(60) Provisional application No. 60/135,946, filed on May 25, 1999.

(51) Int. Cl.$^7$ ............................................. H01L 33/00
(52) U.S. Cl. ............................. 257/98; 257/79; 257/99
(58) Field of Search .............................. 257/91, 98, 99, 257/103; 372/45, 49, 50

(56) References Cited

U.S. PATENT DOCUMENTS

| | | | | |
|---|---|---|---|---|
| 4,419,533 A | * | 12/1983 | Czubatyj et al. | 136/259 |
| 4,626,739 A | * | 12/1986 | Shmulovich | 313/469 |
| 5,008,718 A | * | 4/1991 | Fletcher et al. | 357/17 |
| 5,048,035 A | | 9/1991 | Sugawara et al. | |
| 5,233,204 A | | 8/1993 | Fletcher et al. | |
| 5,301,201 A | * | 4/1994 | Dutta et al. | 372/43 |
| 5,502,316 A | * | 3/1996 | Kish et al. | 257/94 |
| 5,517,039 A | * | 5/1996 | Holonyak, Jr. et al. | 257/94 |
| 5,574,304 A | * | 11/1996 | Mushiage et al. | 257/466 |
| 5,682,043 A | * | 10/1997 | Pei et al. | 257/40 |
| 5,707,745 A | * | 1/1998 | Forest et al. | 428/432 |
| 5,779,924 A | | 7/1998 | Krames et al. | |
| 5,789,768 A | | 8/1998 | Lee et al. | |
| 5,792,698 A | * | 8/1998 | Nishitani | 438/287 |
| 5,793,062 A | | 8/1998 | Kish et al. | |
| 6,107,648 A | * | 8/2000 | Shakuda et al. | 257/103 |
| 6,121,635 A | * | 9/2000 | Watanabe et al. | 257/91 |
| 6,277,665 B1 | * | 8/2001 | Ma et al. | 438/46 |
| 6,287,882 B1 | | 9/2001 | Chang et al. | |
| 6,319,778 B1 | | 11/2001 | Tzer-Perng et al. | |

OTHER PUBLICATIONS

Joji Ishikawa et al, "New double–heterostructure indium–tin–oxide / InGaAsP / AlGaAs surface light–emitting diodes at 650–nm range", Journal of Applied Physics, vol. 66 (5), Sep. 1989, pp. 2181–2185.*
Y.H. Aliyu et al, "AlGaInP LEDs using reactive thermally evaporated transparent conducting indium tin oxide (ITO)", Electronics Letters, vol. 31 (19), Sep. 1995, pp. 1691–1692.*
D.J. Lawrence et al., "GaAsP LED's with Efficient Transparent Contacts for Spatially Uniform Light Emission", IEEE Transactions on Electronic Devices, vol. ED–30 No. 6 (1983) pp. 580–585.
K.L. Chopra et al., "Transparent Conductors–A Status Review", Thin Solid Films, vol. 102(1985) pp. 1–46.

(List continued on next page.)

*Primary Examiner*—Nathan J. Flynn
*Assistant Examiner*—Johannes P Mondt

(57) ABSTRACT

A semiconductor light emitting device comprising an AlGaInP lower confining layer, an AlGaInP active layer, an AlGaInP upper confining layer and a window layer on the upper confining layer using the MOVPE process. The device further contains a hybrid antireflection layer on the top surface and a lower conductive reflector at the substrate interface. The light emitting device has a high surface light-extraction efficiency due to reduced substrate absorption loss and light piping. The hybrid antireflective layer contains at least a conductor layer for uniform current injection and an oxide layer for light extraction and environmental stability.

The device structure contains a hybrid conductive transparent layer on the top surface and a conductive lower reflecting layer. Advantages of the LED in the present invention include highly efficient current-spreading and surface light extraction.

3 Claims, 13 Drawing Sheets

OTHER PUBLICATIONS

Y. Ohba et al., "Growth of High Quality AlGaInP Epilayers by MOCVD and Their Application to Visible Semiconductor Lasers", Journal of Crystal Growth, vol. 77 (1986) pp. 374–379.

J. Ishikawa et al., "New Double Heterostructure ITO/InGaAsP/AlGaAs Surface Light Emitting Diode at 650 nm Range", Journal of Applied Physics, vol. 66 No. 5 (1989) pp. 2181–2185.

D.S. Cao et al., "Use of Tertiarybutylphosphine for OMVPE Growth of AlGaInP", Journal of Electronic Materials, vol. 20 No. 1 (1991) pp. 97–101.

Y. Nishikawa et al., "Effect of V/III Ratio on Zn Electrical Activity in Zn–doped InGaAlP Grown by MOCVD", Journal of Crystal Growth, vol. 108 (1991) pp. 728–732.

H. Hori et al., "MOCVD of InAlP Using Tertiarybutylphosphine", Japanese Journal of Applied Physics, vol. 30 No. 8A (1991) pp. L1343–L1344.

M. Hong et al., "Vertical Cavity Top Surface Emitting Lasers with Thin Ag Mirrors and Hybrid Reflectors", Journal of Crystal Growth, vol. 111 (1991) pp. 1052–1056.

H. Sugawara et al., High Brightness InGaAlP Green Light Emitting Diodes, Applied Physics Letters, vol. 61 No. 15 (1992) pp. 1775–1777.

M.A. Matin et al., "Optically Transparent Indium Tin Oxide Ohmic Contacts in the Fabrication of Vertical Cavity Surface Emitting Lasers", Electronics Letters, vol. 30 No. 4 (1994) pp. 318–320.

J.F. Lin et al., "Growth of a GaP Window Layer on AlGaInP Light Emitting Diodes Using Misoriented Substrates", Journal of Crystal Growth, vol. 142 (1994) pp. 15–20.

H. Wada et al., "Wafer Bonding of InP to Si and its Application to Optical Devices", Japanese Journal of Applied Physics, vol. 37 (1998) pp. 1383–1390.

R. Windisch et al., "Light Emitting Diode with 31% Quantum Efficiency by Outcoupling of Lateral Waveguide Modes", Applied Physics Letters, vol. 74 No. 16 (1999) pp. 2256–2258.

R.H. Horng et al. High–Brightness Wafer–Bonded ITO/LED/Mirror/Si, Jpn. J. Appl. Phys. vol. 40 (2001) pp. 2747–2751 Apr. 2001.

S. Illek et al. Buried Micro–Reflectors Boost Performance of AlGaInP LEDs, Compound Semiconductors, Jan./Feb. (2002) p. 39.

(Editor), UEC Introduces Third Generation AlGaInP LEDs, Compound Semiconductors, Dec. 2000/Jan. 2001, p. 13.

* cited by examiner

SEMICONDUCTOR LIGHT-EMITTING DEVICE AND METHOD FOR MANUFACTURING THE SAME

This application claims the benefit of Provisional Application Ser. No. 60/135,946 filed May 25, 1999.

BACKGROUND OF THE INVENTION

1. Field of the Invention

The present invention relates generally to light-emitting devices and, more particularly, to light emitting devices with reduced light piping for high efficiency AlGaInP-based light emitting diodes (LED's).

2. Discussion of the Prior Art

High efficiency AlGaInP-based amber and red-orange light emitting diodes (LED) are important in applications such as the large area display, traffic signal lighting and automotive lighting. The luminescence performance of the visible LED is determined by the internal quantum efficiency and the light extraction efficiency. High quantum efficiency has been demonstrated in double heterostructure (DH) and quantum well (QW) LED. On the other hand, the light extraction efficiency of the LED is limited by the substrate absorption, the internal reflection at the chip surface and the current crowding under the contact electrode. For example, early AlGaInP LED using a circular ohmic contact has a low efficiency of 0.4 lm/W. The light emission in this device is confined to near the edge of the contact since the majority of the light is generated under and blocked by the contact metal. The prior art approach includes the use of a window layer, a current-blocking layer, a transparent conductive oxide layer and a textured surface to improve the light-extraction efficiency of the LED.

FIG. 1 is a prior art DH-LED on a transparent substrate using a window layer disclosed by F. Kish et al in U.S. Pat. No. 5,793,062. The LED contains a thick GaP window layer allowing the emitted light to escape from the top with reduced total internal reflection loss. The AlGaInP DH 12 are grown on GaAs substrate using the metalorganic vapor phase epitaxy (MOVPE) method comprising an AlGaInP lower confining layer 120, an AlGaInP active layer 122, and an AlGaInP upper confining layer 124. However, the prolonged growth cycle of the 50-um thick GaP window layer 14 at a high temperature causes deterioration of the impurity doping profile and adds cost to the LED wafer. This requires the use of a second crystal growth method such as vapor phase epitaxy (VPE) to deposit the thick window layer due to the high growth rate of VPE for the growth of thick layers. In the transparent substrate (TS) LED design, the LED layer is first grown on GaAs substrate and then lifted off and bonded to a second non-absorbing substrate such as GaP 11. A p-electrode 26 is deposited on top surface of the wafer and an n-electrode 28 is deposited on the back surface of the wafer. The TS-LED, in conjunction with a thick window layer, has been reported to show the best luminescence efficiency to date. The wafer bonding process, however, requires special attention to avoid the inclusion of foreign particulate and to reduce the build up of thermal stress during the bonding and the subsequent annealing process. The process yield is sensitive to the bonding parameters and adds extra cost to the wafer.

FIG. 2 is a prior art DH-LED on GaAs substrate 10 using a current blocking layer (CB) 22 and a distributed Bragg reflector (DBR) 20 disclosed by H. Sugawara et al in Appl. Phys.Lett. vol 61 (1992) pp. 1775. The Bragg reflector 20 was grown on GaAs substrate 10, followed by AlGaInP DH 12, and an n-type AlGaInP blocking layer 22. After photolithographic definition of the blocking layer 22, a p-type AlGaAs current spreading layer 24 was grown over the top followed by a p-GaAs contact layer 16. The p-electrode 26 and the n-electrode 28 were formed using AuZn/Au and AuGe/Au, respectively. In this design, a current blocking layer 22 is used for current spreading whereas a DBR 20 is used to reduce substrate absorption loss. High efficiency LED has been achieved using this design. However, this method requires a second growth step after the definition of the current blocking layer. The quality of the high Al-content current spreading layer is sensitive to the oxygen contamination during the regrowth.

FIG. 3 is a prior art LED using a transparent conductive oxide (TCO) layer 30 with a contact layer 16 and a DBR 20 disclosed by B-J. Lee et al in U.S. Pat. No. 5,789,768. The LED structure is grown using MOVPE and contains an AlGaInP or AlGaAs DBR 20 deposited on GaAs substrate 10, an AlGaInP DH 12 deposited on the DBR 20, a Zn-doped GaP window layer 14 on the DH 12, a p-type Zn-doped GaAs layer 16 on the window layer 14, then over-deposited with a TCO layer 30 after an opening is defined in the center of the p-GaAs contact layer 16. The DH 12 comprises an Si-doped AlGaInP lower cladding layer 120, an AlGaInP active layer 122 and a Zn-doped AlGaInP upper cladding layer 124. The GaP window layer 14 is 4–10 um thickness. The p-GaAs contact layer 16 is Zn-doped to $5 \times 10^{18}$ cm$^{-3}$ with a resistivity of 0.01 ohmcm. The current injection under the electrode 26 is blocked due to the Shottky contact formation between TCO layer 30 and GaP window layer 14. The injected current diffuses away from the electrode 26 and conducts through the p-type contact layer 16. However, the TCO is an n-type semiconductor and it forms a rectifying contact with p-type semiconductors. The resistivity of TCO is $3 \times 10^{-4}$ ohmcm that is two orders of magnitude higher than for a good conductor such as silver. This has limited the use of TCO to reduce the current crowding under the p-electrode 26. FIG. 4 is the calculated current spreading for a 250 um×250 um die and a contact pad diameter of 84 um. It is shown that a thick ITO layer is needed for efficient current spreading due to the limited conductivity of TCO. However, it is impractical to deposit thick ITO films using the conventional vacuum deposition methods. For the conventional case, the ITO film is reactively deposited at around 60 angstrom/min in $10^{-4}$ torr oxygen partial pressure. For this reason, the prior art LED still requires the use of a current-blocking layer for current spreading even with a TCO layer on the surface. To correct the problem, an object of the present invention is to use a hybrid TCO/conductor layer for current spreading and surface light-extraction for high efficiency LED applications.

The prior LED design contains a DBR 20 at the lower interface to reduce substrate absorption. However, DBR stack 20 is only reflective for normal light incidence as in the case of the vertical cavity surface emitting laser (VCSEL) applications. FIG. 5 shows the reflectance spectrum of a typical DBR stack comprising a stack of 20 pairs of quarter wavelength GaAs/AlInP layers. The DBR stack is nearly 40% reflective at the design wavelength of 570 nm. Due to its limited bandwidth, a separate DBR is needed for LED emitting a different color. Moreover, due to the nondirectional light emission of the LED, the reflective power is much less for light entering the DBR at greater angles. FIG. 6 shows the calculated angular variation of the reflectance of the GaAs/AlInP DBR. The reflectance of the DBR drops rapidly at an incident angle greater than about 20 degree, causing optical loss due to the light transmission into the absorbing substrate.

Even with an ideal DBR at the substrate interface, most of the emitted light is piped to the side of the chip due to TIR at the top surface. Light piping causes multiple absorption loss of the emitted light before it exits to outside of the chip. For this reason, QW LED with very thin active layers is preferred to reduce the light absorption loss in the active layer. In order to minimize absorption loss due to the light piping, another object of the present invention is to reduce the optical loss due to the light piping by maximizing the surface light extraction using a hybrid antireflective layer.

SUMMARY OF THE INVENTION

The aforementioned deficiencies are addressed, and an advance is made in the art, by employing, in a light emitting diode structure, a hybrid anti-reflection (AR) and high reflection (HR) layers comprising a TCO layer and a conductor layer for surface light extraction and uniform current injection of the LED.

In accordance with an illustrative embodiment of the present invention, an LED includes a hybrid conductive transparent layer on the top surface and a conductive lower reflecting layer. The top transparent layer comprises a thin conductor layer such as Ag and a transparent conductive oxide layer such as $SnO_2$. The high conductivity of Ag enables uniform current injection and forms ohmic contacts between the conductive oxide layer and the semiconductor. The top oxide layer serves to protect the Ag film from environmental degradation and to promote the anti-reflection for light emission from the LED surface.

The lower reflective layer also comprises a conductor film such as Ag and an upper oxide layer such as ITO. The reflector is first deposited on a second substrate and then wafer bonded to the AlGaInP LED. The downward emitting light is reflected away from the light absorbing substrate and escape at the top surface. The optical loss due to light piping and substrate absorption is thus minimized in the high efficiency LED. The ITO layer serves to prevent the Ag layer from degradation and to promote the adhesion of the layers during the wafer bonding process. The LED in the present invention is advantageous in terms of simple processing and cost effective as compared with the conventional structure using a thick window layer and a current-blocking layer for current-spreading.

BRIEF DESCRIPTION OF THE DRAWINGS

The present invention will be best understood by reference to the detailed description which follows, and to the accompanying drawings, in which.

DETAILED DESCRIPTION OF THE INVENTION

The LED in the present invention uses a hybrid conductive AR and HR layer comprising a TCO layer and a conductor layer such as Ag to obtain a high surface extraction efficiency of the emitted light. Examples of the TCO include tin oxide, indium tin oxide, zinc oxide, cadmium stannate and doped oxides. The TCO layer is fabricated using conventional thin film deposition techniques including evaporation and sputtering deposition as described by K. L. Chopra et al in Thin Solid Films Vol. 102 (1985) pp.1–46. Among the candidate metal films, Ag has an excellent conductivity of $2 \times 10^{-6}$ ohmcm and a relatively low absorption in the visible range of the spectrum. Other metal film such as Cr has been used to improve the ohmic contact between TCO and GaAsP as described by D. J. Lawrence et al., in IEEE Transactions on Electronic Devices, Vol.ED-30 No.6 (1983) pp. 580–585. However, Cr absorbs in the visible range of the spectrum making itself less attractive as a contact metal for LEDs. On the other hand, TCO has a relatively high optical transmittance and a relatively low electrical resistance. The figure-of-merit that is the ratio of the optical transmittance to the sheet resistance is much higher for TCO than for Ag. A sputtering deposited ITO film has a band gap of 3.75 eV and an electron mobility of 35 $cm^2/Vs$ at a carrier concentration of $10^{21}$ $cm^{-3}$. The typical resistivity value thus obtained for ITO is $2 \times 10^{-4}$ ohmcm which is two orders of magnitude higher than for Ag. For efficient current spreading, a conductor is strongly favored as compared with the prior art current-diffusion materials. The resistivity of these materials is in the order of Ag($2 \times 10^{-6}$ ohmcm)<ITO($2 \times 10^{-4}$ ohmcm, n=$10^{21}$ $cm^{-3}$)<GaP(0.1 ohmcm, p=$10^{18}$ $cm^{-3}$ )<AlGaAs(0.16 ohmcm, p–$1 \times 10^{18}$ $cm^{-3}$)<AlInp(1.18 ohmcm, p=$5 \times 10^{17}$ $cm^{-3}$)<AlGaInP(2 ohmcm, p=$3 \times 10^{17}$ $cm^{-3}$). The LED in the present invention uses hybrid TCO and Ag layers forming highly conductive AR and HR layers for uniform current spreading and high surface light extraction efficiency.

Figure 1:
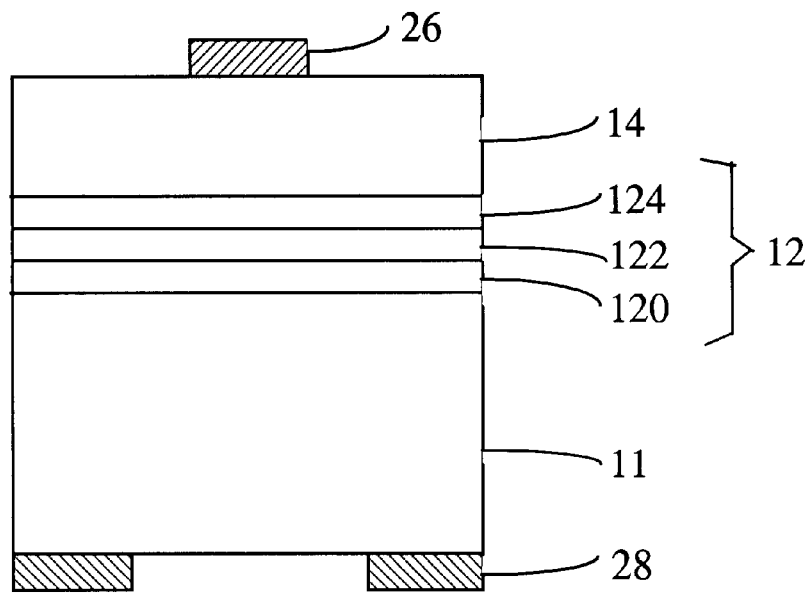
FIG. 1 is a prior art transparent substrate LED with a window layer.
Figure 2:
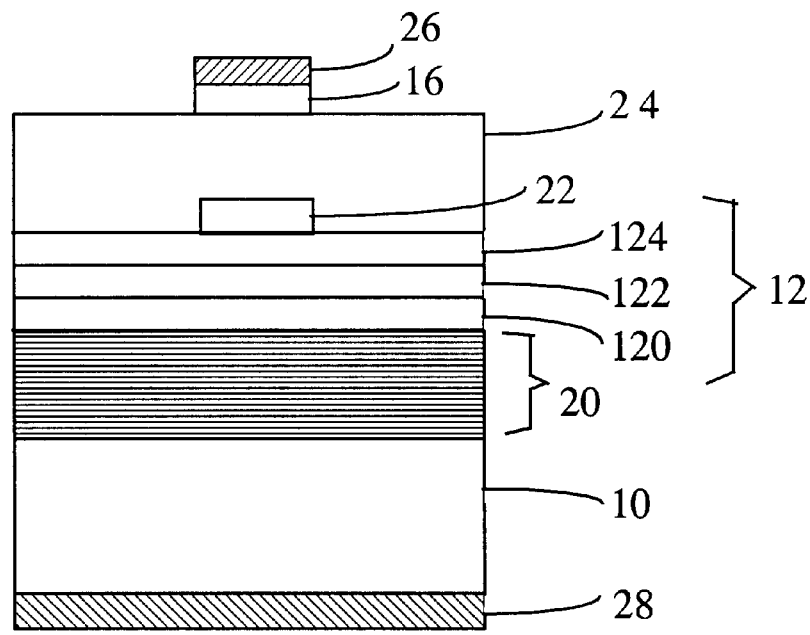
FIG. 2 is a prior art LED on GaAs substrate using a current-blocking layer and a DBR.
Figure 3:
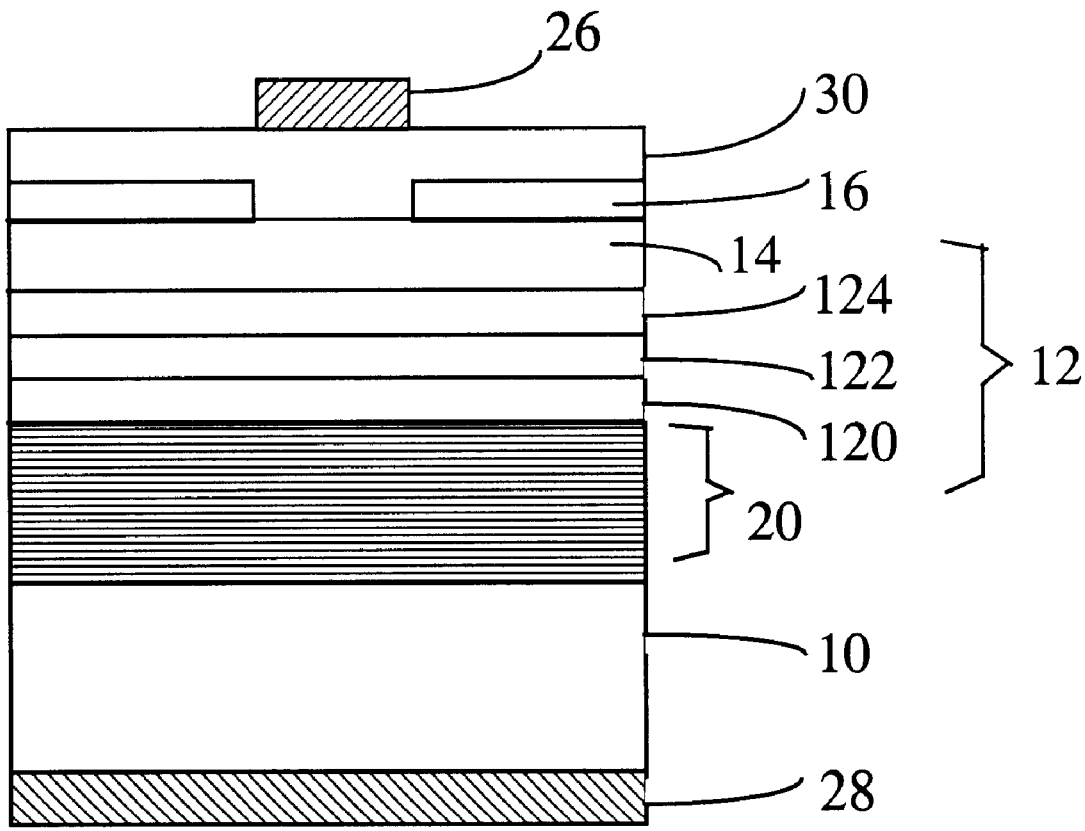
FIG. 3 is a prior art LED on GaAs substrate using a transparent conductive oxide layer with a current-blocking layer.
Figure 4:
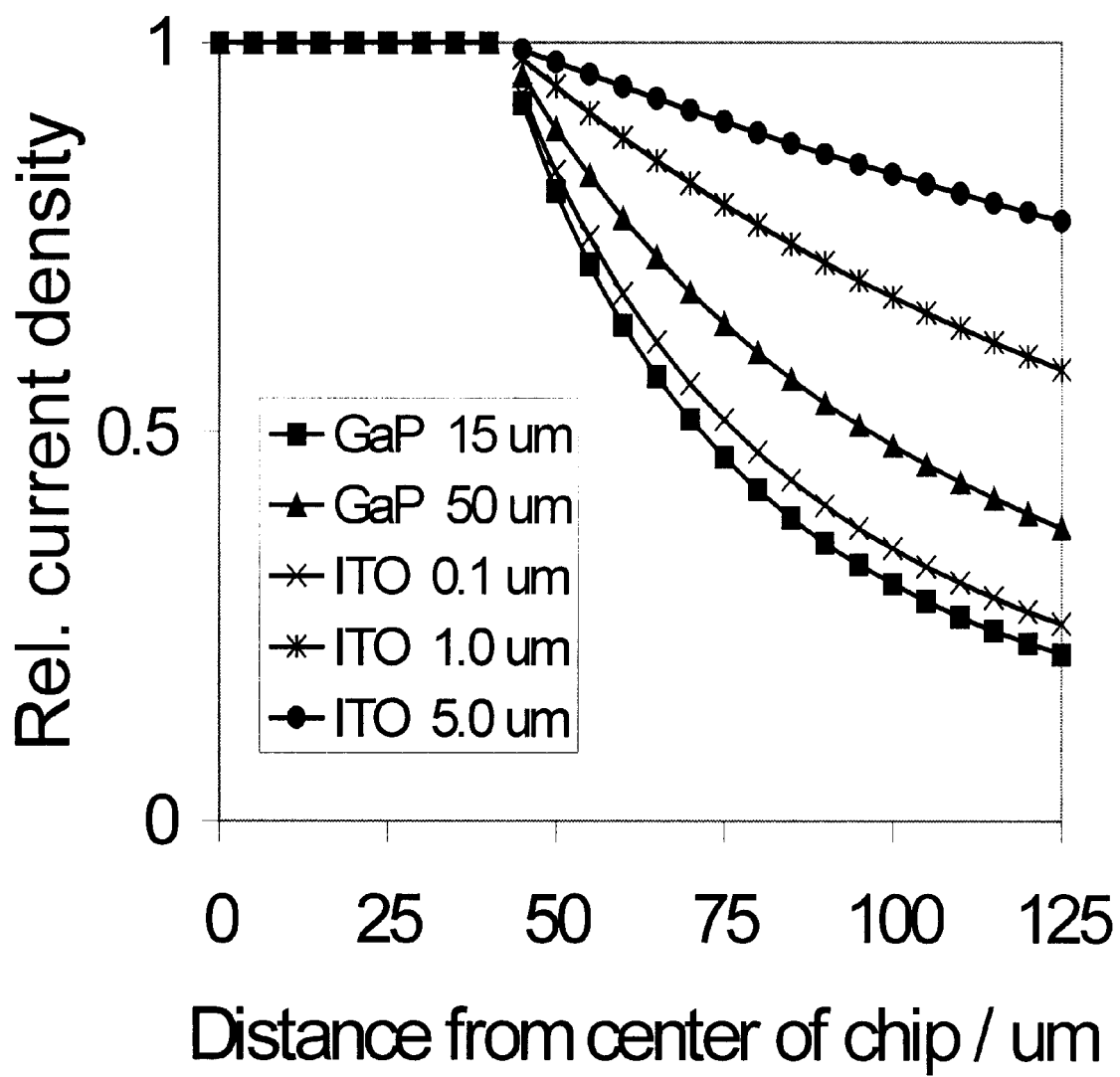
FIG. 4 is the calculated current spreading of GaP and ITO layers for a 250 um×250 um die and a contact pad diameter of 84 um.
Figure 5:
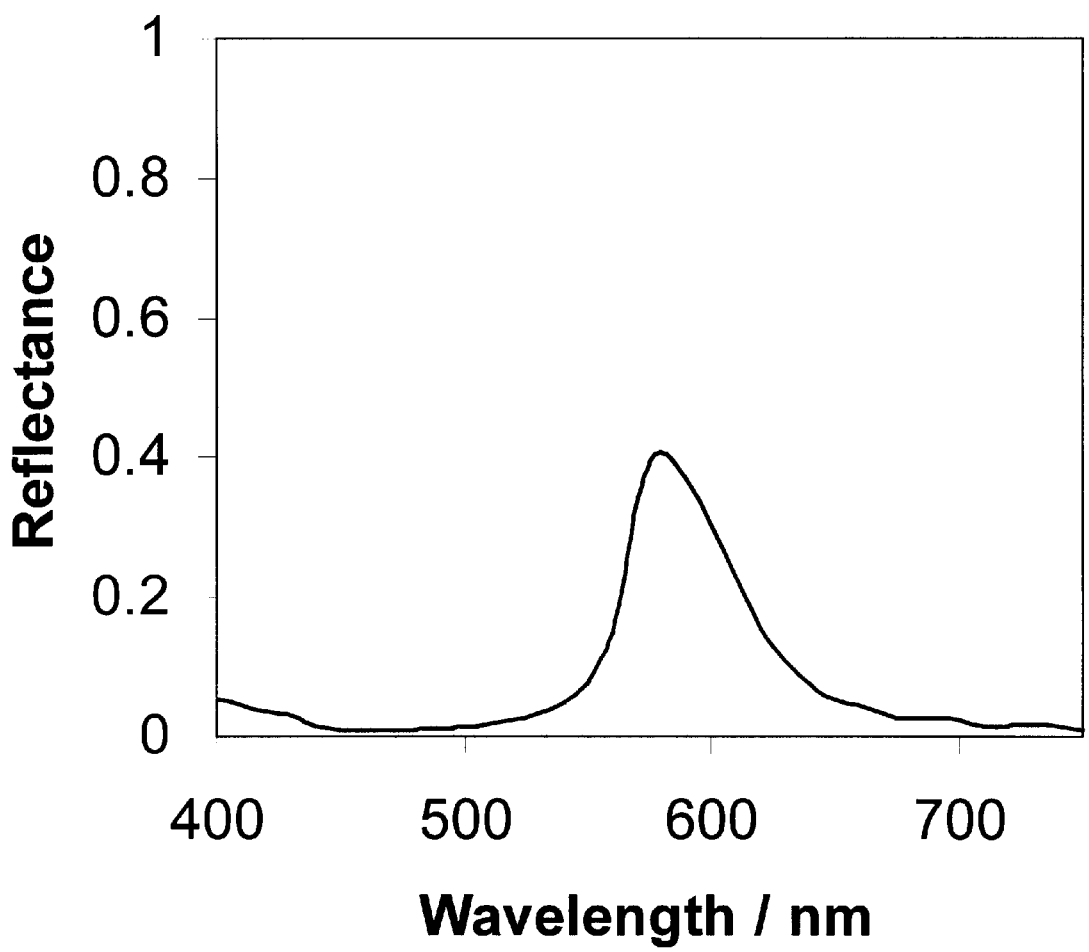
FIG. 5 is the reflectance spectrum of a prior art DBR comprising a stack of 20 pairs of quarter wavelength GaAs/AlInP layers with a center reflectance at 570 nm.
Figure 6:
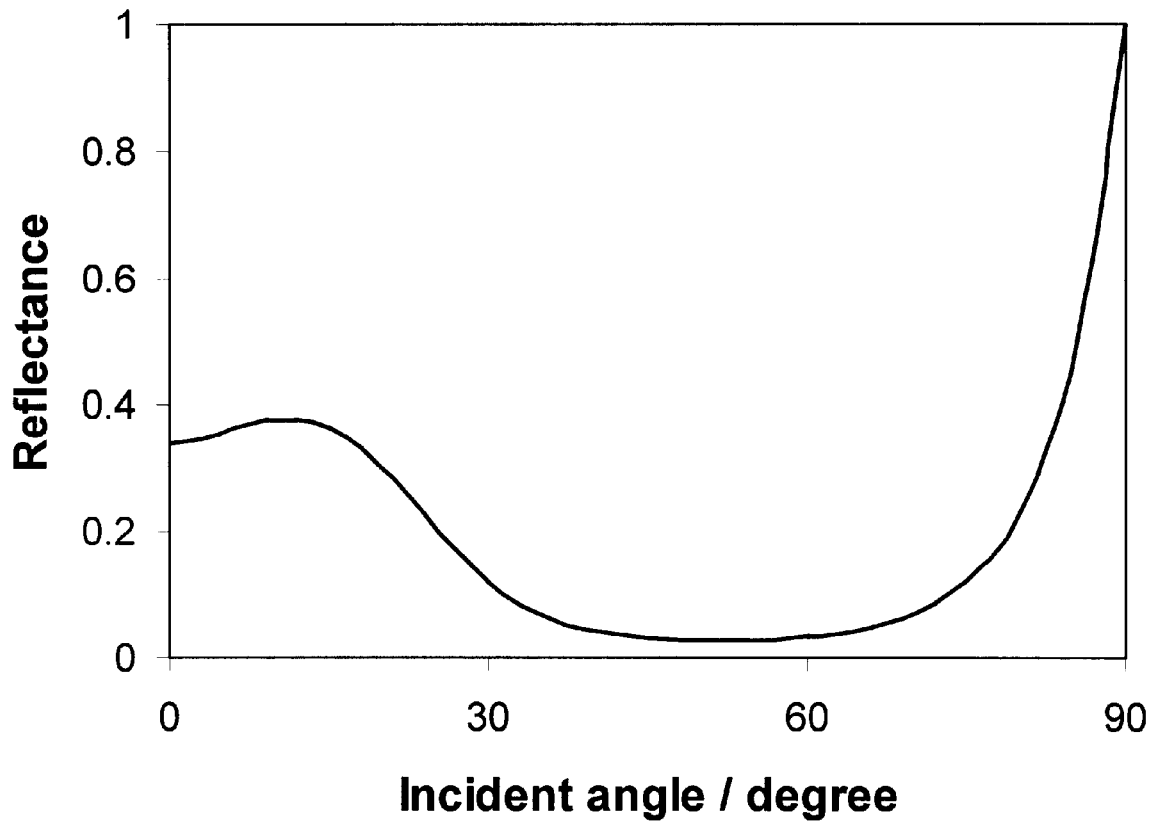
FIG. 6 is the calculated angular variation of the reflectance of a GaAs/AlInP DBR.
Figure 7:
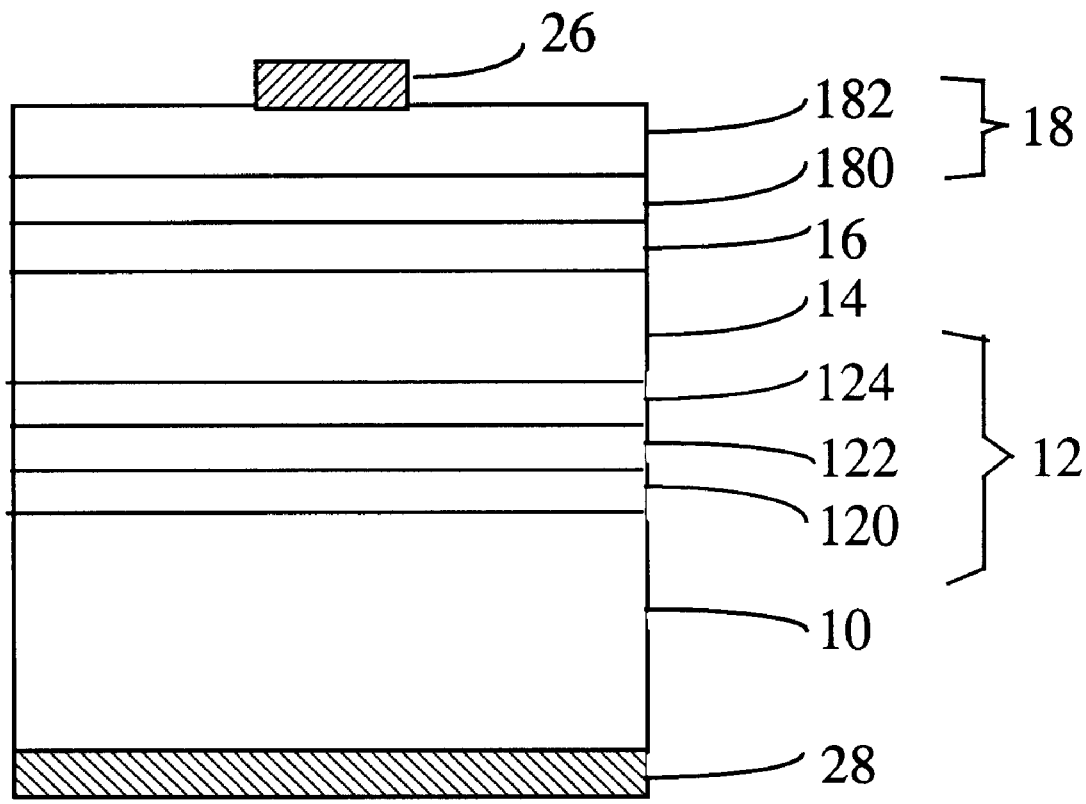
FIG. 7 is a schematic diagram of an LED constructed in accordance with an illustrative embodiment of the present invention using a conductive antireflection stack.

FIG. 7 is a schematic diagram of a LED in accordance with the embodiment of the present invention. An AlGaInP DH 12 is deposited on GaAs substrate 10 . The DH comprises a lower n-AlGaInP cladding layer 120, an AlGaInP active layer 122 and an upper p-AlGaInP cladding layer 124.

A p-type GaP window layer 14 is deposited on top of the upper cladding layer 124 and a p-type GaAs contact layer 16 is deposited on the window layer 14. After the MOVPE growth, the wafer is transferred to a vacuum deposition reactor to grow the top antireflection stack 18, comprising a Ag layer 180 on top of the upper cladding layer 124 and a TCO layer 182 preferably $SnO_2$ on the Ag layer 180. An n-metal such as AuGeNi 28 is then formed on the backside of the GaAs substrate 10. The preferred thickness of the AlGaInP layers is 0.5–1 um and the p-type GaP window layer 14 is preferably 2–15 um in thickness.

The preferred method to fabricate the AlGaInP layers is MOVPE. Typical source nutrients include trimethyl compounds such as TMGa, TMIn, TMAl for group III elements, and group V hydrides such as arsine and phosphine for the group V elements. Disilane and dimethyl zinc are typically used as the n- and p-type dopants, respectively. The process is preferably carried out in a reduced pressure reactor about 0.1 atm and a high substrate temperature of 760 degree centigrade for the growth of high Al-content layers. A high V/III ratio is preferred for the growth of AlGaInP layers and substrate rotation is employed to improve the growth uniformity.

Figure 8:
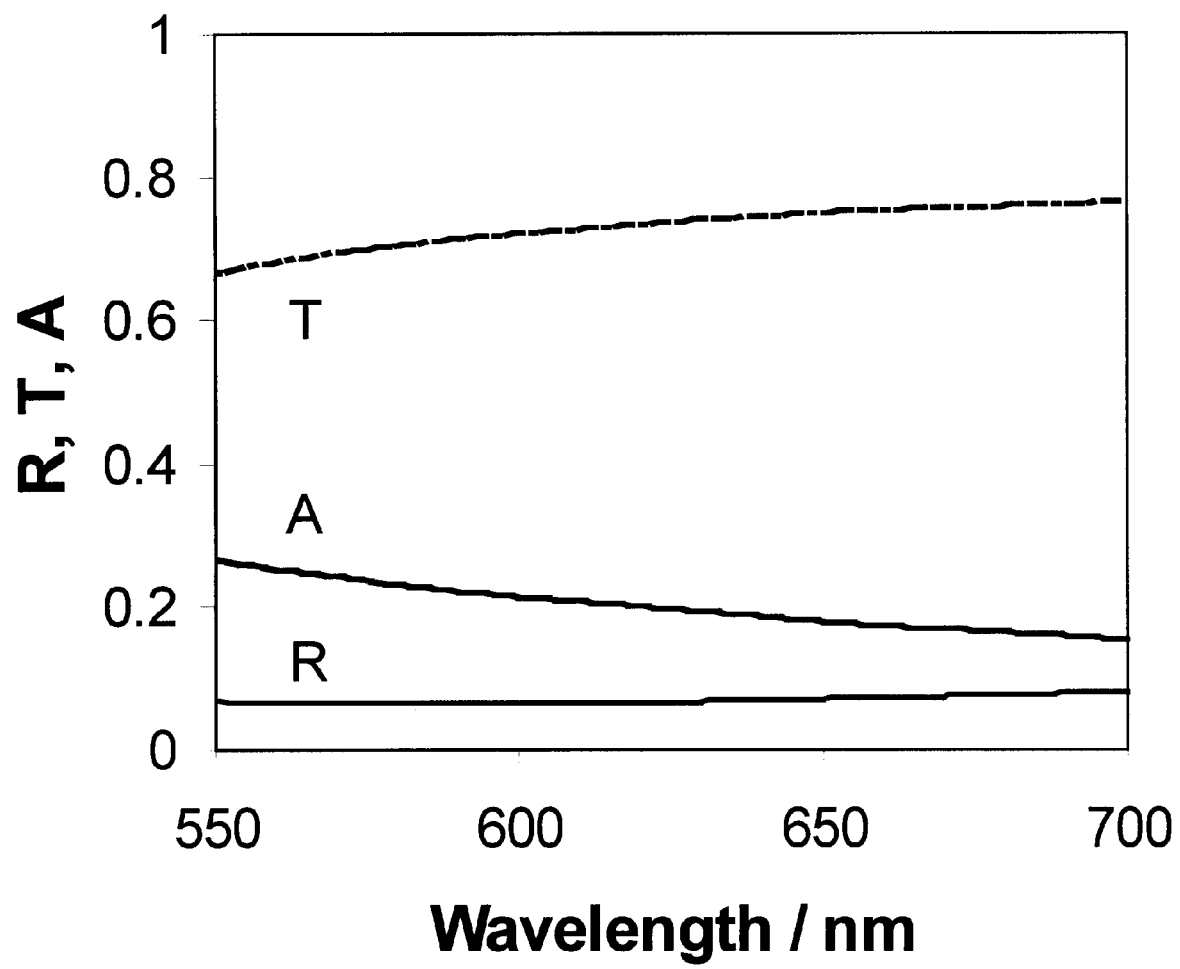
FIG. 8 is the calculated transmittance, reflectance and absorbance spectrum of the hybrid antireflective stack of an LED constructed in accordance with an embodiment of the present invention comprising a 15 nm Ag layer and an upper 50 nm tin oxide layer.
Figure 9:
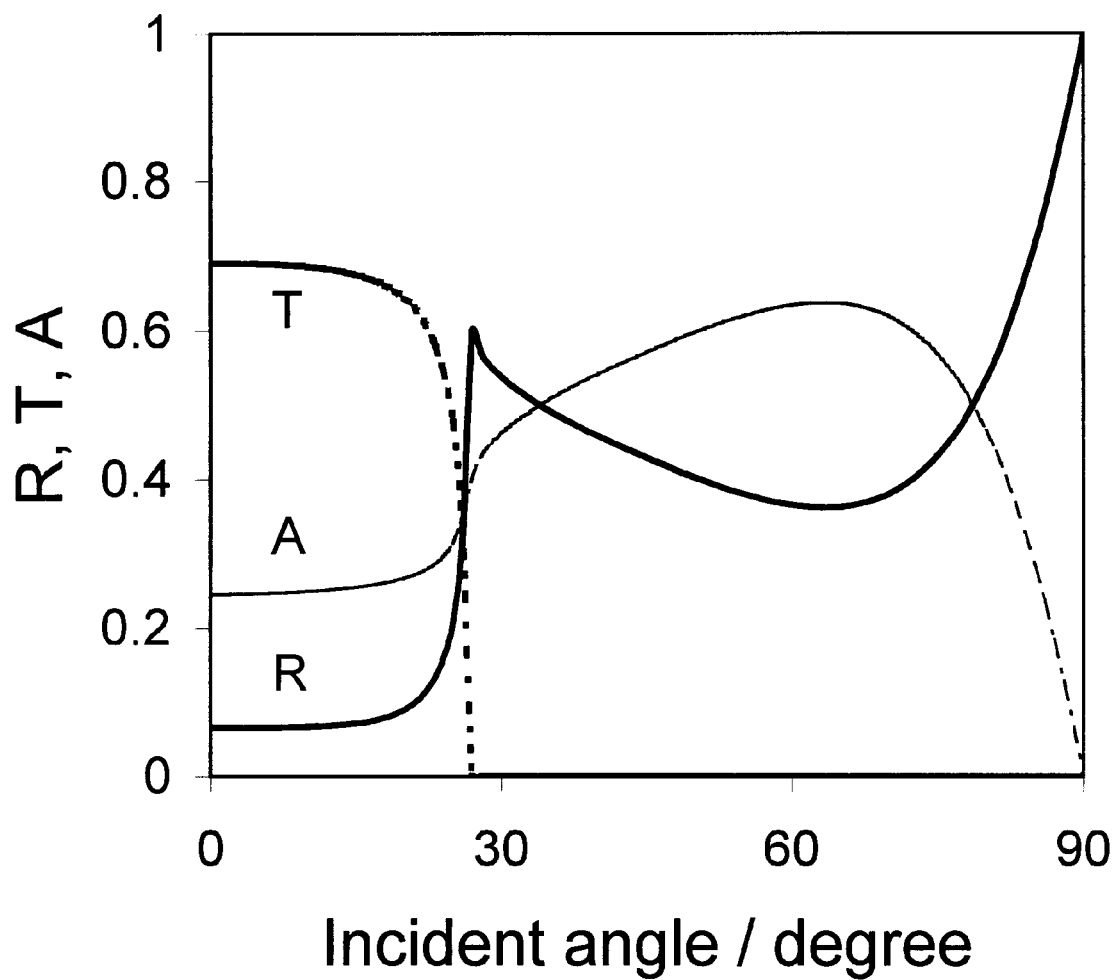
FIG. 9 is the calculated angular variation of the transmittance, reflectance and absorbance at 600 nm of the hybrid antireflective stack of an embodiment of an LED constructed in accordance with the present invention comprising 15 nm Ag and 50 nm tin oxide layer.

The preferred method to fabricate the top TCO and conductor layers include vacuum evaporation and sputtering deposition. The preferred oxide is tin oxide with a thickness of 10–90 nm preferably 45–55 nm. The preferred conductor layer is Ag with a thickness of 2–30 nm preferably 12–15 nm. The preferred top antireflective stack comprises 12–15 nm Ag layer and 45–55 nm tin oxide layer. FIG. 8 is the calculated transmittance, reflectance and absorbance spectrum of the hybrid antireflective stack of the LED in the present invention comprising a 15 nm Ag layer and an upper 50 nm tin oxide layer. The result shows a high transmittance over 70% in the whole spectrum range from 550 nm to 650 nm. This allows the use of one antireflection layer for LEDs emitting different colors of light. FIG. 9 shows the angular variation of the transmittance, reflectance and absorbance at 600 nm of the hybrid antireflective stack of the LED in the present invention comprising 15 nm Ag and 50 nm tin oxide layer. The low-angle transmittance is nearly 70% and drops to zero at 26.2 degree due to internal reflection. In the mid-angle range, the absorbance increases to above 60% due to light absorption in the GaAs layer. Above 80 degree, the reflectance rises sharply approaching 100% for grazing incidence of light.

Figure 10:
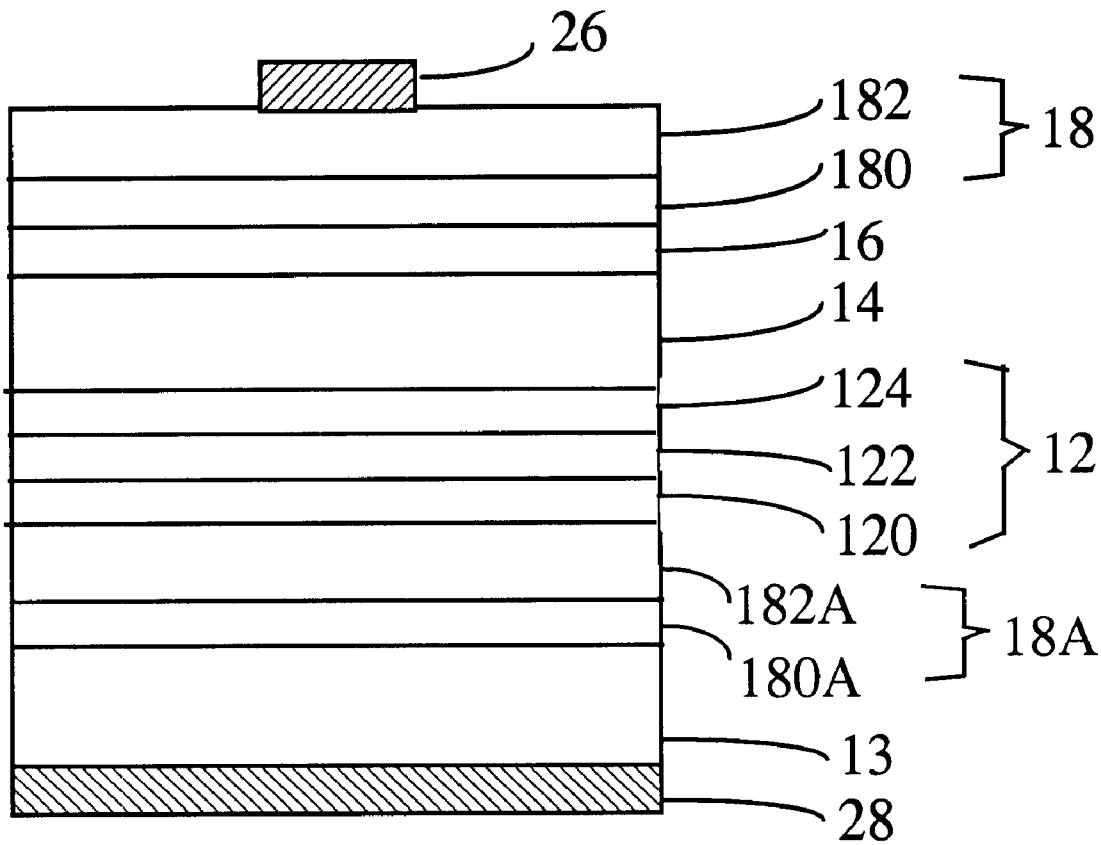
FIG. 10 is a schematic diagram of an LED constructed in accordance with an embodiment of the present invention containing a hybrid reflective layer at the substrate interface.

FIG. 10 is a schematic diagram of a further improvement of the LED in accordance with the embodiment of the present invention using a reflective layer at the substrate interface to reduce substrate absorption loss. The reflective layer can be grown using a DBR stack before growing the AlGaInP DH. More preferably, the reflective stack is first deposited on a second substrate then wafer bonded to the LED. This allows for the adoption of a mirror with a higher reflective power than for the prior art DBR wherein the reflectivity is restricted by the small index step and the angle of light incidence. The reflective layer comprises a 30–150 nm Ag layer and a 20–100 nm ITO layer on top, preferably using a hybrid stack comprising a 50 nm Ag layer and a 50 nm ITO layer. The highly reflective Ag layer is thus covered with a stable ITO film to avoid environmental degradation especially from the airborne sulfides. This allows for easy wafer handling during the bonding process in ambient.

The methods of forming the Ag and the ITO films include vacuum deposition techniques such as evaporation and sputtering deposition, preferably using the sputtering method to form Ag and ITO films in a continuous deposition cycle without breaking the vacuum. J. Ishikawa et al has described the fabrication of ITO films using the rf sputtering methods in Journal of Applied Physics Vol. 66 No. 5 (1989) pp. 2181–2185. An ITO target composition of 5% tin oxide in indium oxide was used at an Ar pressure of 0.006 torr and a rf power of 50 W. M. A. Martin et al has described the fabrication of ITO using reactive sputtering methods in Electronics Letters Vol.30 No.4 (1994) pp.318–320. The ITO film was deposited by rf sputtering at 13.56 MHz in a mixture of Ar 10% oxygen 90% at a base pressure of $8\times10^{-7}$ torr and a deposition pressure of 0.005 torr. Subsequent annealing of the 150 nm thick sputtered ITO layer at 550 degree centigrade was useful for good transparent ohmic contacts with a low resistivity of 0.002 ohmcm.

The method of fabrication of the LED in FIG. 10 with a reflective mirror at the substrate interface is now described. The AlGaInP LED 12 is first deposited on a first substrate of GaAs using the MOVPE method as described above. After deposition of the reflective mirror on a second substrate 13 the second wafer is bonded to the AlGaInP LED. F. A. Kish et al have described methods of wafer bonding of LED to a transparent substrate in U.S. Pat. No. 5,502,316. The AlGaInP DH 12 is grown on a 250 to 500 um thick first substrate of n-type GaAs, comprising a GaAs buffer layer, a 800 nm thick AlGaInP lower confining layer 120, a 500 nm thick AlGaInP active layer 122, a 800 nm thick AlGaInP upper confining layer 124, followed by a window layer 14 and a p-type contact layer 16. The LED is then wax bonded to a supporting plate and the first GaAs substrate is removed using lapping and chemical etching to produce a clean planar surface ready to bond to a second transparent substrate. The surface of the bonding substrates is degreased in organic solvents and etched in ammonia to remove the surface oxide, then immersed in methanol and placed face-to-face to facilitate van der Waals bonding. The wax support is removed from the LED in warm solvent and then the sample is thermally annealed under a load to improve the bonding strength and the electrical properties of the device.

In the present invention, the LED wafer is bonded to the oxide surface of the reflective mirror on a second substrate. H. Wada et al have described the methods of bonding InGaAsP surface emitting lasers to oxide surface of an $Al_2O_3$/Si stacked mirror deposited on Si substrate in Jpn. J. Appl. Phys. Vol.37 (1998) pp1383–1390. The InGaAsP laser stack is grown on an InP substrate after the growth of a 0.1 um InGaAsP etch-stop layer. The wafer is then stuck on a glass plate with wax and the substrate and the etch stop layer are selectively etched away. The surface of the exposed InP and the $Al_2O_3$ top layer is then cleaned using $H_2SO_4$:$H_2O_2$:$H_2O$. After rinsing and spin-drying, the bonding surfaces are placed in contact under a pressure at room pressure. Then the bonded wafer is immersed in a warm solvent to remove the wax and the supporting plate. The sample is then annealed at 400 degree centigrade for 30 minutes in hydrogen to increase the bonding strength. In the present invention, the wafer bonding can also be performed using other heating sources such as microwave heating. This is realized due to the presence of the conductor layer in the close proximity of the bonding interface. The microwave energy absorbed by the conductor layer creates a local heating zone near the bonding interface. This local heating facilitates the fusion process for effective bonding of the wafers.

Figure 11:
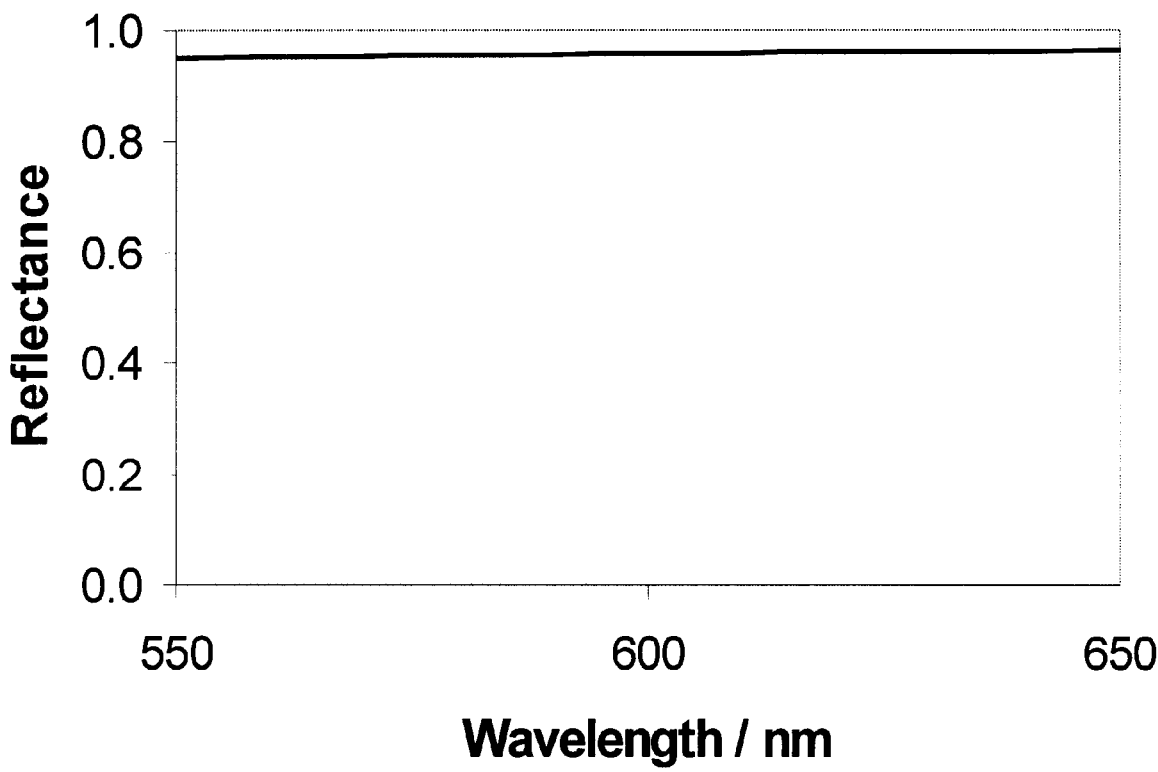
FIG. 11 is the calculated reflectance spectrum of the hybrid reflective layer of an LED constructed in accordance with an embodiment of the present invention comprising 50 nm Ag and 50 nm indium tin oxide layer.
Figure 12:
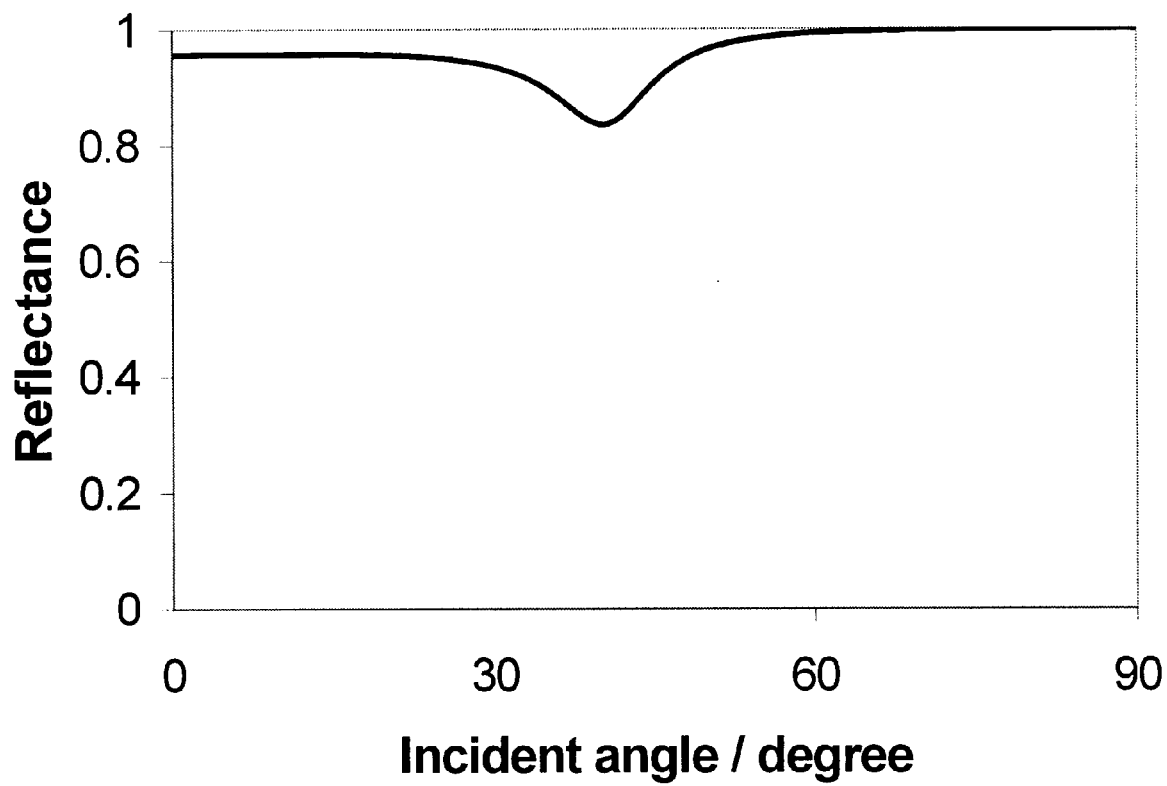
FIG. 12 is the calculated angular variation of the reflectance at 600 nm of the hybrid reflective layer of the LED in the present invention comprising 50 nm Ag and 50 nm indium tin oxide layer.

FIG. 11 is the calculated reflectance spectrum of the reflective stack comprising 50 nm of Ag and 50 nm of indium tin oxide layer of the LED in the present invention. The calculated reflectance is as high as 95% in the spectrum range of 550–650 nm. It allows the use of one reflector design for LEDs emitting lights in different color thus simplifying the fabrication process. FIG. 12 is the calculated angular variation of the reflectance at 600 nm of the reflective stack of the LED in the present invention comprising 50 nm of Ag and 50 nm of indium tin oxide layer. The reflective mirror has a high reflectance above 95% for small-angle incident light and becomes 100% reflective in the high-angle region as a result of the total reflection. The reflection minimum is above 80% at around 40 degree. Thus the reflective mirror of the LED in the present invention assures a very high reflecting power for light emitted in all oblique angles. The large angular bandwidth of the reflector in the present invention allows the use of a second substrate 13 that is absorbing such as GaAs, InP, Si, Ge, or transparent such as GaP, SiC, and sapphire. This opens up a wide range of substrate choice and allows for the use of a large size, low cost wafer to reduce the cost of the LED.

Figure 13:
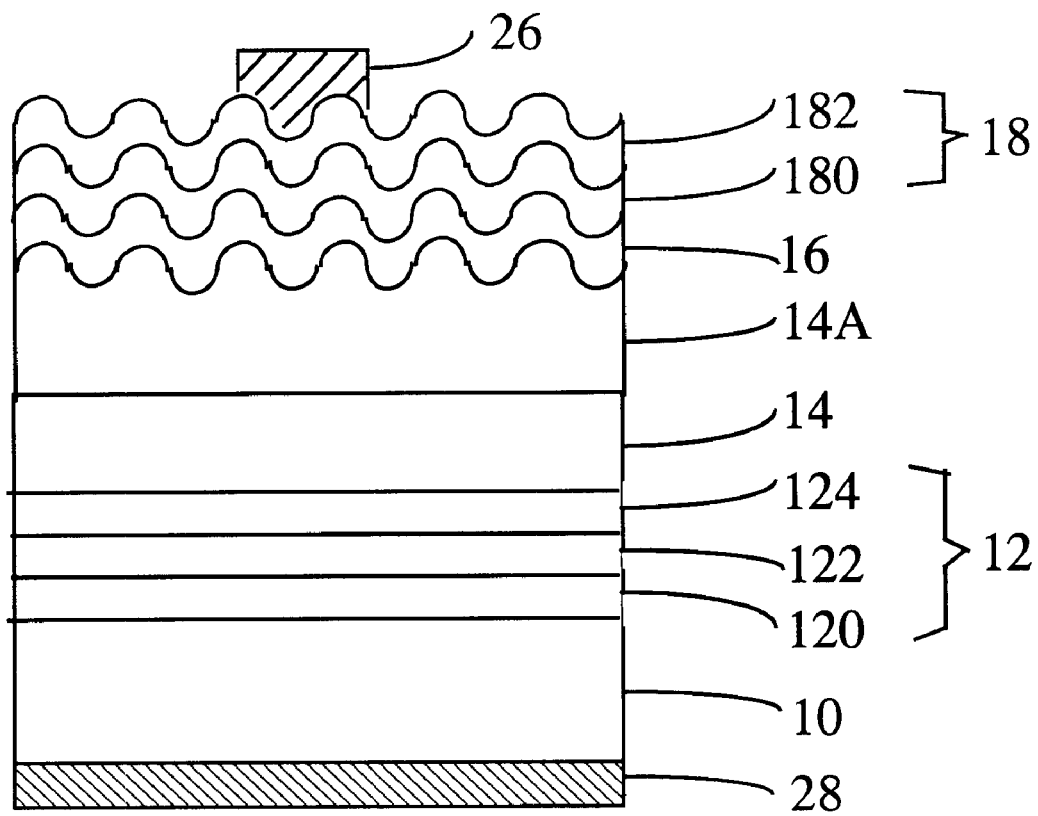
FIG. 13 is a schematic diagram of an LED in accordance with the present invention using a hybrid conductive antireflection stack on a textured surface.

FIG. 13 is a schematic diagram of a further improvement of the LED in accordance with the embodiment of the present invention using a conductive antireflection layer on a textured surface. This design is advantageous since it allows even more of the emitted light to exit from the surface of the chip. The prior art LEDs have a relatively low surface light-extraction efficiency due to reflection at the chip-to-ambient boundary. The Snell's Law predicts that the emitted light will be totally reflected back at the chip-to-ambient boundary above a critical angle of 17 and 25 degree as the light exit to the air and epoxy dome, respectively. The overall surface extraction-efficiency is only 2% chip-to-air and 5% chip-to-dome, taking into account the Fresnel reflection loss at the surface. The use of ITO with a refractive index of 2.1 on top of the chip helps to improve the light extraction due to better index matching at the surface boundary. However, it has been shown in FIG. 9 that the transmission of the 15 nm Ag/50 nm tin oxide stack drops to zero as the incident angles approaching 26.2 degree due to total internal reflection. To further improve light extraction for light entering at large incident angles, another object of the present invention is to maximize the surface light extraction by using a textured antireflection layer at the top surface of the LED.

M. R. Krames et al have described an ordered interface texture LED in U.S. Pat. No. 5,779,924. R. Windisch et al have described a textured top surface LED with 31% external quantum efficiency in Applied Physics Letters Vol.74 No.16 (1999) pp.2256–2258. K. Nishitani et al have described random surface texture LED using a surface light scattering layer in U.S. Pat. No. 5,792,698. For example, the LED has an AlGaInP light scattering layer on top of AlGaAs current diffusion layer. A rough light scattering layer was grown using a low V/III ratio during the MOVPE process. As described by K. Nishitani et al in U.S. Pat. No. 5,792, 698, a light scattering layer is deposited on top of the current spreading layer after the growth of the AlGaInP DH layers. The V/III ratio for forming the light scattering layer is 20 or below when the current spreading layer is AlGaAs using arsine as the group V hydride. When the current diffusion layer is AlGaInP, the V/III ratio for forming the light scattering layer is 150 or below. However, the quality of the AlGaInP layers is inferior due to the low electrical activity of the Zn dopant and a high concentration of deep levels induced under these growth conditions. The effect of V/III ratio on p-type AlGaInP grown by MOVPE has been reported by Y. Nishikawa et al in Journal of Crystal Growth Vol.108 (1991) pp. 728–732.

To solve these problems, the LED shown in FIG. 13 in the present invention uses a conductive antireflection layer on a textured surface. The textured surface is formed by reducing the substrate temperature, lowering the V/III ratio, and increasing the growth rate during the growth of the upper portion of the window layer. The method of fabrication of the LED is described as follows. An AlGaInP DH 12 is first deposited on the GaAs substrate 10 using the MOVPE method as described above, comprising an AlGaInP lower confining layer 120, an AlGaInP active layer 122, and an AlGaInP upper confining layer 124. The AlGaInP layers are readily grown at a substrate temperature of 760 degree centigrade and a V/III ratio of 200 to 250. A GaP, AlInP or AlGaP window layer 14 is then deposited on the AlGaInP DH 12 at a substrate temperature of 700 to 800 degree centigrade and a V/III ratio of above 200. The surface of the layers is smooth and mirror-like when deposited under these optimum conditions. After initial growth of the window layer, at least an upper portion of the window layer 14A is grown at a reduced substrate temperature at, for example, below 760 degree centigrade for GaP and below 650 degree centigrade for AlInP. The layers thus deposited have a random textured surface. The effect of the MOVPE growth on the surface morphology of GaP, GaInP and AlInP has been described by Y. Ohba et al in Journal of Crystal Growth Vol.77 (1986) pp.374–379, H. Hori et al in Japanese Journal of Applied Physics, Vol.30 No.8A (1991) pp.L1342–L1344 and by J. F. Lin et al in Journal of Crystal Growth Vol.142 (1994) pp.15–20. The growth is finished with a p-type GaAs contact layer 16 on top of the window layer. The wafers are then transferred to a vacuum chamber to deposit the conductive antireflection layer 18 as described above.

The textured surface is further formed using tertiarybutylphosphine (TBP) instead of phosphine during the growth of the upper portion of the GaP or AlInP window layer 14A. The MOVPE growth of AlGaInP using TBP has been described by D. S. Cao et al in Journal of Electronic Materials, Vol.20 No.1 (1991) pp.97–101. The group III precursors are trimethylalumium (18 degree centigrade), trimethylgallium (−12 degree centigrade), trimethylindium (17 degree centigrade). The TBP bubbler is held at 10 degree centigrade. The hydrogen carrier gas flow rate is 5 l/m and the substrate temperature is 680 degree centigrade. The MOVPE growth is carried out at a chamber pressure of 1 atmosphere. Under these conditions, the growth rate of AlGaInP layers is as high as 12 um/hr suitable for the growth of the thick AlGaInP window layers for the LED. Moreover, the surface morphology of the deposited AlGaInP layer is sensitive to the V/III ratio during crystal growth. A smooth surface is obtained when the V/III ratio is above 70. Lower V/III ratios generate rough surfaces. The degree of surface roughness is related to the V/III ratio. An object of the present invention is to maximize the light extraction using the textured antireflective surface of the LED. This is achieved by proper choice of the group V sources, V/III ratio and substrate temperature during the growth of the upper window layer.

Figure 14:
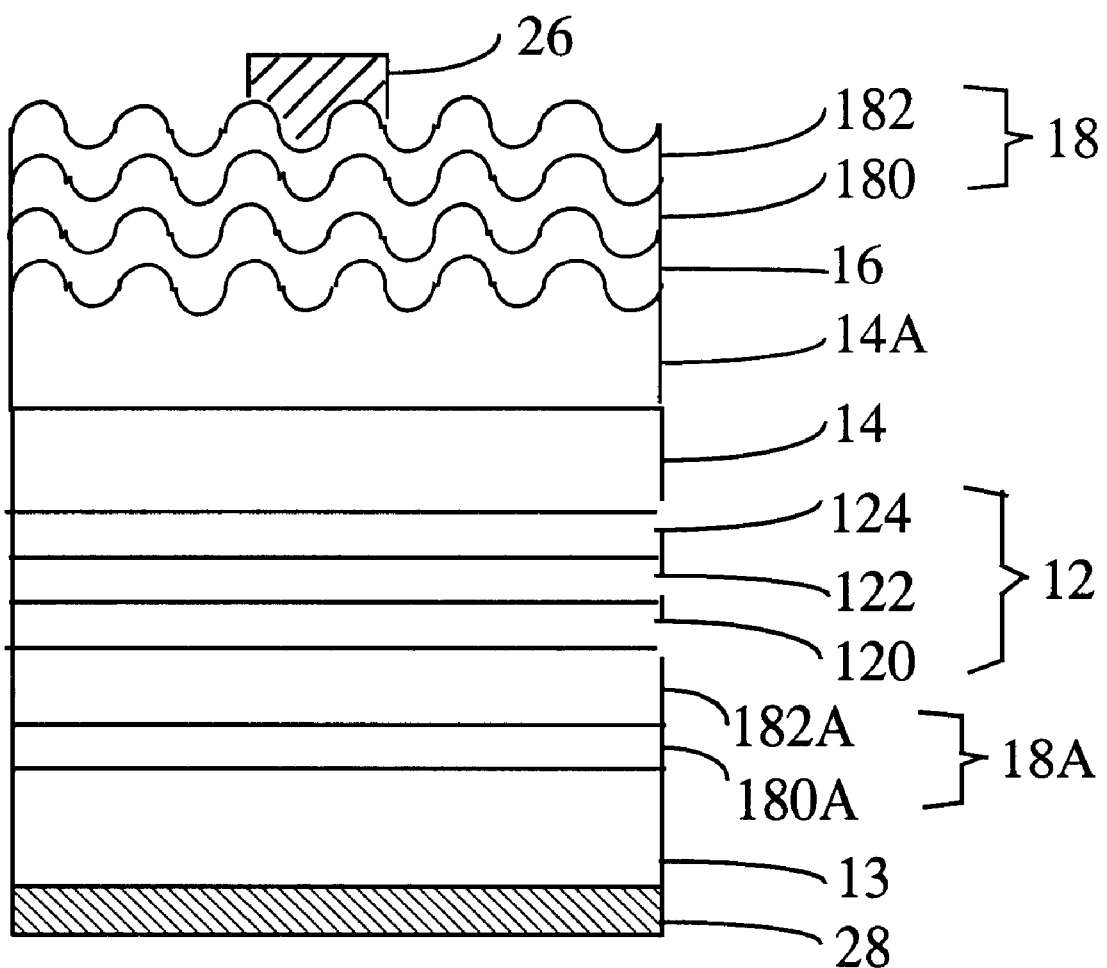
FIG. 14 is a schematic diagram of an LED in accordance with an embodiment of the present invention using a textured surface antireflection layer and a lower reflective layer.

FIG. 14 is a schematic diagram of a further improvement of the LED in accordance with the embodiment of the present invention using a hybrid antireflection layer 18 on a textured top surface and a hybrid reflective layer 18A at the substrate interface. The methods of fabrication of the AlGaInP DH 12 and the top and the lower hybrid conductive layers have been described above. The principle of operation of the preferred LED assures that the light emitted downwards is reflected back and extracted from the top surface of the chip. The optical loss due to the light piping and the substrate absorption is thus minimized and a high surface light-extraction efficiency of the LED is obtained.

What is claimed is:

1. A semiconductor light-emitting device comprising:
   a foreign substrate on a first electrode;
   an active layer bounded by an upper and a lower confining layer overlaying said foreign substrate;
   a window layer overlaying said upper confining layer;
   a contact layer overlaying said window layer;
   a second electrode on said contact layer;
   a first metal layer between said contact layer and said second electrode, and overlaying the entire surface of said contact layer;

a first transparent conductive oxide layer between said first metal layer and said second electrode, and overlaying the entire surface of said first metal layer;

a second metal layer between said foreign substrate and said lower confining layer;

a second transparent conductive oxide layer between said second metal layer and said lower confining layer.

2. The device of claim 1, wherein said second metal layer comprises silver having a thickness of from 30 to 150 nm.

3. The device of claim 1, wherein said second transparent conductive oxide layer comprises indium tin oxide having a thickness of from 20 to 100 nm.

* * * * *